United States Patent
Ahmed et al.

(10) Patent No.: US 7,505,294 B2
(45) Date of Patent: Mar. 17, 2009

(54) TRI-LEVEL INVERTER

(75) Inventors: Sayeed Ahmed, Canton, MI (US); Fred Flett, Bloomfield, MI (US); Ajay V. Patwardhan, Canton, MI (US); Douglas K. Maly, Canton, MI (US)

(73) Assignee: Continental Automotive Systems US, Inc., Auburn Hills ( * ) Notice: Subject to any disclaimer, the term of this patent is extended or adjusted under 35 U.S.C. 154(b) by 888 days.

(21) Appl. No.: 10/658,804

(22) Filed: Sep. 9, 2003

(65) Prior Publication Data

US 2006/0274561 A1     Dec. 7, 2006

Related U.S. Application Data

(60) Provisional application No. 60/471,387, filed on May 16, 2003.

(51) Int. Cl.
   H05K 7/02      (2006.01)
   H02M 7/5387    (2007.01)

(52) U.S. Cl. .................. 363/141; 363/132; 363/144; 363/147

(58) Field of Classification Search .................. 363/95, 363/97, 98, 131, 144, 146, 147, 132, 141
See application file for complete search history.

(56) References Cited

U.S. PATENT DOCUMENTS

| | | | |
|---|---|---|---|
| 4,142,231 A | 2/1979 | Wilson et al. | 363/141 |
| 4,224,663 A | 9/1980 | Maiese et al. | 363/144 |
| 4,458,305 A | 7/1984 | Buckle et al. | 363/141 |
| 4,661,897 A | 4/1987 | Pitel | 363/17 |
| 4,674,024 A | 6/1987 | Paice et al. | 363/71 |
| 5,172,310 A | 12/1992 | Deam et al. | 363/144 |
| 5,184,291 A | 2/1993 | Crowe et al. | 363/37 |
| 5,230,632 A | 7/1993 | Baumberger et al. | 439/66 |
| 5,243,757 A | 9/1993 | Grabbe et al. | 29/882 |
| 5,264,761 A | 11/1993 | Johnson | 315/291 |
| 5,395,252 A | 3/1995 | White | 439/66 |
| 5,422,440 A | 6/1995 | Palma | 174/133 B |
| 5,439,398 A | 8/1995 | Testa et al. | 439/801 |
| 5,445,526 A | 8/1995 | Hoshino et al. | 439/69 |
| 5,459,356 A | 10/1995 | Schulze et al. | 257/773 |
| 5,508,560 A | 4/1996 | Koehler et al. | 257/730 |
| 5,517,063 A * | 5/1996 | Schantz et al. | 307/9.1 |
| 5,537,074 A | 7/1996 | Iversen et al. | 327/564 |
| 5,544,412 A * | 8/1996 | Romero et al. | 29/832 |
| 5,559,374 A | 9/1996 | Ohta et al. | 257/723 |
| 5,574,312 A * | 11/1996 | Bayerer et al. | 257/706 |
| 5,635,751 A | 6/1997 | Ikeda et al. | 257/584 |
| 5,644,483 A * | 7/1997 | Peng et al. | 363/37 |
| 5,653,598 A | 8/1997 | Grabbe | 439/66 |
| 5,756,935 A | 5/1998 | Balanovsky et al. | 174/52.1 |
| 5,847,951 A | 12/1998 | Brown et al. | 363/147 |

(Continued)

OTHER PUBLICATIONS

Ghali, F., et al., "Dynamic Analysis of Hybrid Wind/Diesel System with Three-Level Invereter," *IEEE, PCC-Osaka 2002*, pp. 727-732, 2002.

(Continued)

*Primary Examiner*—Gary L Laxton (57) ABSTRACT

A tri-level inverter power module has an architecture employing a high degree of modularity that allows a base power module to be quickly, easily, and cost effectively configured to address a large variety of applications.

15 Claims, 10 Drawing Sheets

U.S. PATENT DOCUMENTS

| | | | | |
|---|---|---|---|---|
| 5,938,451 | A | | 8/1999 | Rathburn ................... 439/66 |
| 5,975,914 | A | | 11/1999 | Uchida ...................... 439/66 |
| 6,054,765 | A | | 4/2000 | Eytcheson et al. ........... 257/724 |
| 6,072,707 | A | | 6/2000 | Hochgraf ................... 363/71 |
| 6,078,173 | A | | 6/2000 | Kumar et al. ............ 324/158.1 |
| 6,078,501 | A | | 6/2000 | Catrambone et al. ........ 361/704 |
| 6,166,937 | A | * | 12/2000 | Yamamura et al. .......... 363/141 |
| 6,176,707 | B1 | | 1/2001 | Neidich et al. ............... 439/66 |
| 6,212,087 | B1 | | 4/2001 | Grant et al. ................. 363/144 |
| 6,292,371 | B1 | | 9/2001 | Toner, Jr. ................... 361/752 |
| 6,434,008 | B1 | | 8/2002 | Yamada et al. ............. 361/728 |
| 6,507,108 | B1 | * | 1/2003 | Lindemann et al. ......... 257/724 |
| 6,603,672 | B1 | | 8/2003 | Deng et al. .................. 363/37 |
| 6,903,931 | B2 | * | 6/2005 | McCordic et al. ........... 361/711 |
| 2002/0034088 | A1 | * | 3/2002 | Parkhill et al. .............. 363/144 |
| 2002/0111050 | A1 | | 8/2002 | Parkhill et al. ................ 439/65 |
| 2002/0118560 | A1 | | 8/2002 | Ahmed et al. .............. 363/144 |
| 2002/0126465 | A1 | | 9/2002 | Maly et al. .................. 361/818 |
| 2002/0167828 | A1 | | 11/2002 | Parkhill et al. .............. 363/144 |

OTHER PUBLICATIONS

Kim, T-J., et al., "The Analysis of Conduction and Switching Losses in Multi-Level Inverter System," *IEEE*, pp. 1363-1368, 2001.

Mohan et al., *Power Electronics: Converters, Applications and Designs*, John Wiley & Sons Inc., USA, 1989, Chapter 26-8, "Circuit Layout," p. 654.

Newton, C., et al., "Neutral Point Control for Multi-Level Inverters: Theory, Design and Operational Limitations," *IEEE Industrial Applications Society Annual Meeting*, New Orleans, LA, Oct. 5-9, 1997, pp. 1336-1343.

Persson, E., "Power Electronic Design and Layout Techniques for Improved Performance and Reduced EMI," in *Proceedings of Power Electronics in Transportation, IEEE*, Dearborn, Michigan, Oct. 20-21, 1994, pp. 79-82.

Ratnayake, K., et al., "Novel Carrier PWM Scheme to Control Neutral Point Voltage Fluctuations in Three-Level Voltage Source Inverter," *IEEE Intl. Conf. on Power Electronics and Drive Systems*, PEDS '99, Jul. 1999, Hong Kong, pp. 663-667.

Seo, J., et al., "A New Simplified Space-Vector PWM Method for Three-Level Inverters," *IEEE Transactions on Power Electronics* 16(4):545-550, Jul. 2001.

U.S. Appl. No. 10/642,424, filed Aug. 14, 2003, Ahmed et al.
U.S. Appl. No. 60/233,922, filed Sep. 20, 2000, Parkhill et al.
U.S. Appl. No. 60/233,993, filed Sep. 20, 2000, Ahmed.
U.S. Appl. No. 60/233,994, filed Sep. 20, 2000, Maly et al.
U.S. Appl. No. 60/233,995, filed Sep. 20, 2000, Maly et al.
U.S. Appl. No. 60/233,996, filed Sep. 20, 2000, Parkhill et al.
U.S. Appl. No. 60/471,387, filed May 16, 2003, Flett et al.

* cited by examiner

TRI-LEVEL INVERTER

CROSS-REFERENCE TO RELATED APPLICATION

This application claims the benefit of U.S. Provisional Patent Application No. 60/471,387, filed May 16, 2003; where this provisional application is incorporated herein by reference in its entirety.

BACKGROUND OF THE INVENTION

1. Field of the Invention

This disclosure is generally related to electrical power systems, and more particularly to power module architectures suitable for inverting, rectifying and converting of electrical power between power sources and loads.

2. Description of the Related Art

Power modules are typically self-contained units that transform and/or condition power from one or more power sources for supplying power to one or more loads. Power modules commonly referred to as inverters transform direct current (DC) to alternating current (AC), for use in supplying power to an AC load, for example, a three-phase electric motor.

There are a large variety of applications requiring transformation of a DC source into power for an AC load. For example, a DC power source such as a fuel cell system, battery and/or ultracapacitor may produce DC power, which must be inverted to supply power to an AC load such as a three-phase AC motor in an electric or hybrid vehicle. A photo-voltaic array may produce DC power which must be inverted to supply or export AC power to a power grid of a utility. Applications may also require transformation of a DC source into power for multiple AC loads at various voltage levels. Other types of power modules also are commonly used, such as a rectifier to transform AC to DC and a DC/DC converter to step up or step down a DC voltage.

Addressing these various applications sometimes requires the custom design of a suitable power module. Custom designing of power modules results in costs related to the design process, as well as duplicative costs related to the creation of custom tooling, the manufacture of custom parts, and maintenance of separate inventories. Custom designing also increases time to market. It would be desirable to have a power module that allows the investment in design, tooling, manufacturing and inventorying to be shared across many application specific products, which, among other things, may shorten the time needed to bring products to the market.

SUMMARY OF THE INVENTION

The present devices and methods are directed to an architecture for a power module for a tri-level inverter. The architecture provides a high degree of modularity that allows a base module to be quickly, easily and cost effectively configured as a tri-level inverter, and without requiring complex external wiring schemes.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various embodiments of the invention. However, one skilled in the art will understand that the invention may be practiced without these details. In other instances, well-known structures associated with power modules, power semiconductor devices and controllers have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

The headings provided herein are for convenience only and do not interpret the scope or meaning of the claimed invention.

Base Power Module

Figure 1:
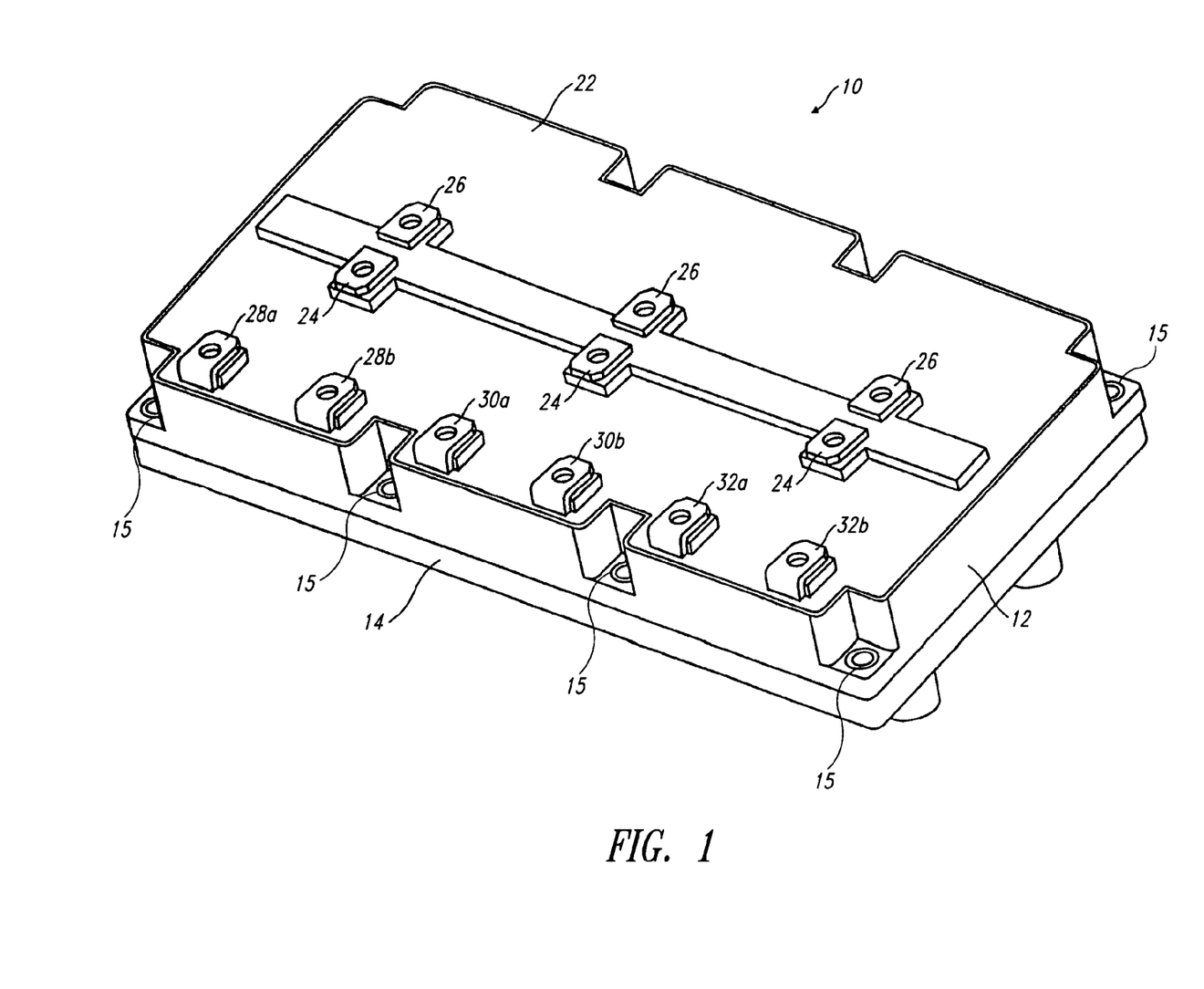
FIG. 1 is an isometric view of a power module comprising a housing, integrated cold plate, DC bus terminals, AC phase terminals, and power semiconductor devices.
Figure 2A:
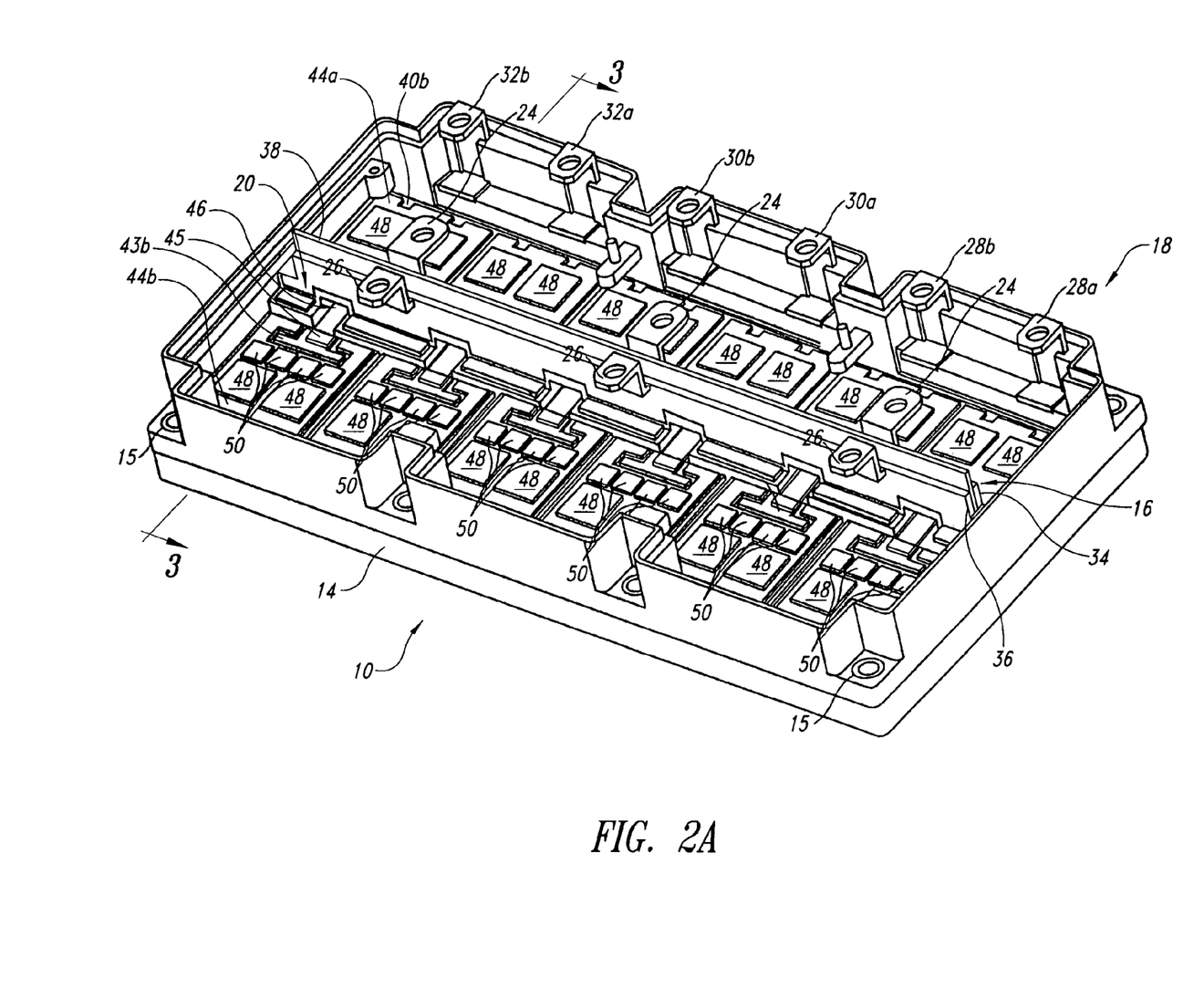
FIG. 2A is an isometric view of the power module of FIG. 1 with a cover removed and some portions broken or removed to show the DC bus, the AC bus, and the power semiconductor devices carried by a number of regions carried by a substrate.
Figure 2B:
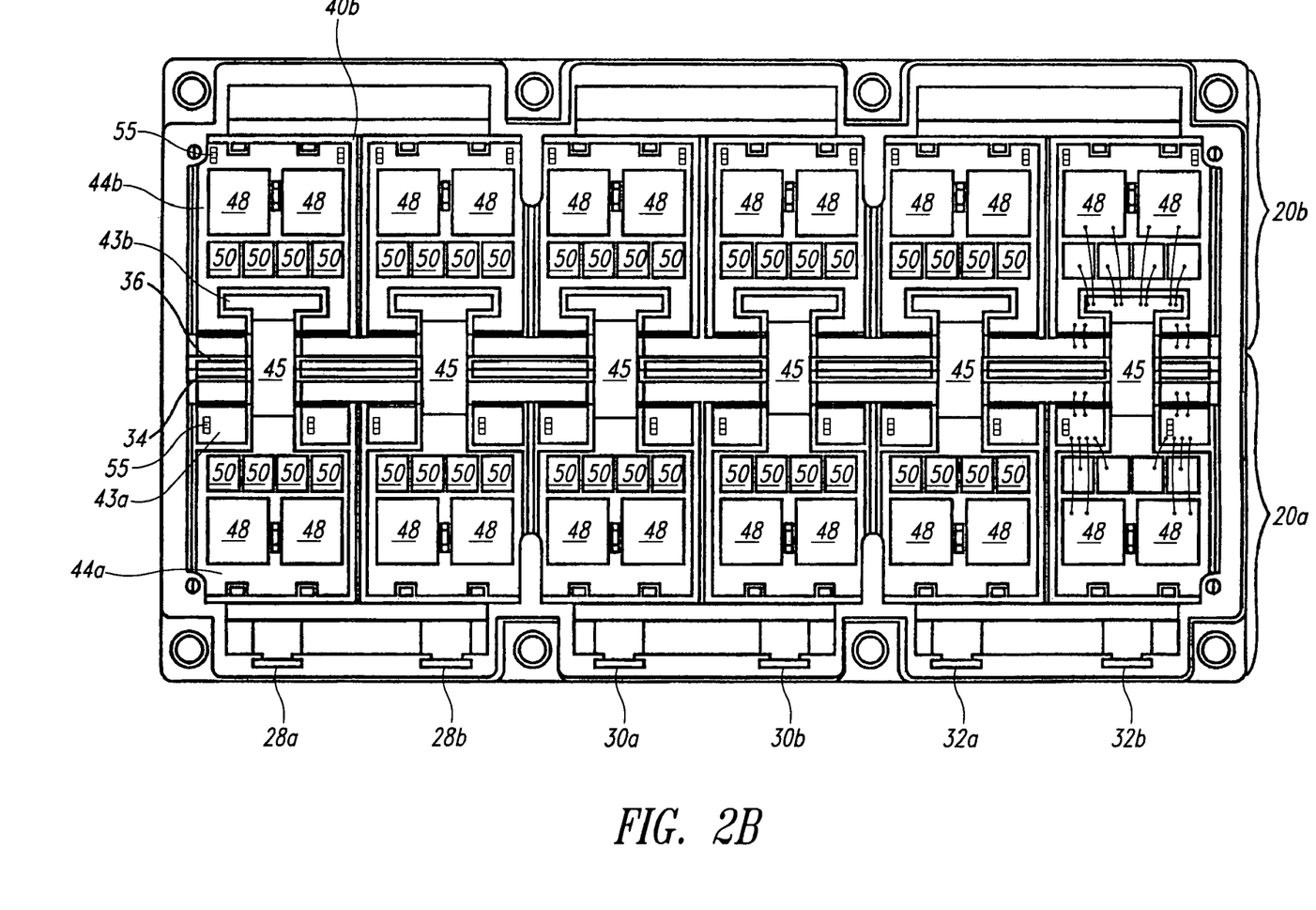
FIG. 2B is a top plan view of the power module of FIG. 2A showing a representative sampling of wire bonds electrically connecting various power semiconductor devices, buses, and layers in the substrate as an inverter.

FIGS. 1, 2A, and 2B show a base power module 10, generally comprising: a lead frame or housing 12, an integrated cold plate 14 attached to the housing 12 via bushings 15, a DC bus 16, an AC bus 18; and power semiconductor devices 20 electrically coupled between the DC bus 16 and AC bus 18, forming a high side 20b and a low side 20a of the power module 10. The base power module 10 may further include one or more gate drivers 22 for driving some of the power semiconductor devices 20.

Two sets of DC bus terminals 24, 26 extend out of the housing 12. In some applications one set of DC bus terminals 26 is electrically coupled to a positive voltage or high side of a power source or load and the other set of DC bus terminals 24 is electrically coupled to a negative voltage or low side of the power source or load. In other applications, the DC bus terminals 24, 26 are electrically coupled to respective DC bus terminals 24, 26 on another power module. A set of AC phase terminals comprises three pairs of AC bus phase terminals 28a, 28b, 30a, 30b, 32a, 32b, extending out of the housing 12. As discussed in detail below, in some applications, one pair of AC phase terminals is coupled to a respective phase (A, B, C) of a three phase power source or load. In other applications, some of the AC phase terminals are interconnected across or between the pairs, and coupled to power sources or loads.

Figure 3:
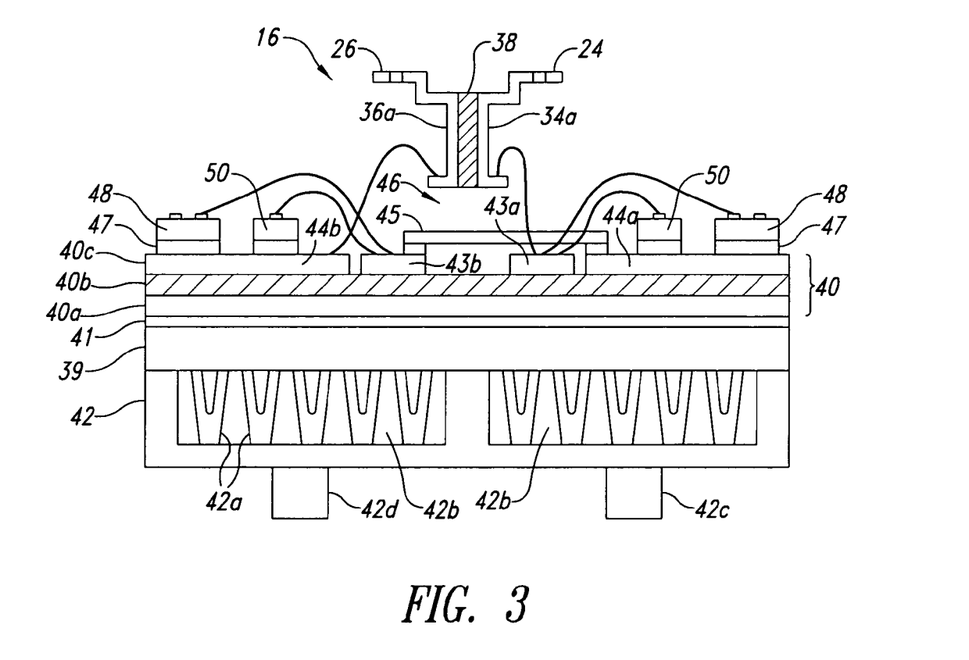
FIG. 3 is a schematic cross sectional view of one embodiment of the DC bus comprising a pair of L-shaped DC bus bars spaced by an electrical insulation.

FIG. 3 shows a schematic cross-sectional view of the power module 10 taken along section line 3-3 of FIG. 2A. FIG. 3 is not an exact cross-sectional view, but has been modified to more accurately represent the electrical connections which would otherwise not be clearly represented in the FIG. 3.

The integrated cold plate 14 comprises a metal base plate 39, a direct copper bonded (DCB) substrate 40 which is attached to the metal base plate 39 by a solder layer 41. A cooling header 42 includes a number of cooling structures such as fins 42a, one or more fluid channels 42b, and a fluid inlet 42c and a fluid outlet 42d for providing fluid connection flow to and from the fluid channels 42b, respectively.

The DCB substrate 40 typically comprises a first copper layer 40a, a ceramic layer 40b and a second copper layer 40c which are fused together. The second copper layer 40c may be etched or otherwise processed to form electrically isolated patterns or structures, as is commonly known in the art. For example, the second copper layer 40c may be etched to form regions of emitter plating 43a and collector plating 44a on a low side of the power module 10 (i.e., side connected to DC bus bar 34). Also for example, the second copper layer 40c may be etched to form regions of emitter plating 43b and collector plating 44b on the high side of the power module 10 (i.e., the side connected to DC bus bar 36).

A conductive strip 45 or wire bonds may extend between the collector plating 44a of the low side and the emitter plating 43b of the high side, passing through respective passages 46 formed under the DC bus bars 34, 36. As illustrated, the conductive strip 45 has been exaggerated in length on the low side of the power module 10 to better illustrate the electrical connection with the collector plating 44a.

The power semiconductor devices 20 are attached to the various structures formed in the second copper layer 40c via a solder 47. The power semiconductor devices 20 may include one or more switches for example, transistors 48 such as integrated bipolar gate transistors (IGBTs) or metal oxide semiconductor field effect transistors (MOSFETS). The power semiconductor devices 20 may also include one or more diodes 50. The power semiconductor devices 20 may have one or more terminals directly electrically coupled by the solder 47 to the structure on which the specific circuit element is attached. For example, the collectors of IGBTs 48 may be electrically coupled directly to the collector plating 44a, 44b by solder 47. Similarly, the cathodes of diodes 50 may be electrically coupled directly to the collector plating 44a, 44b by solder 47.

The DC bus 16 comprises a pair of L-shaped or vertical DC bus bars 34a, 36a. The upper legs of the L-shaped DC bus bars 34a, 36a are parallel and spaced from one another by the bus bar insulation 38. The lower legs of the L-shaped DC bus bars 34a 36a are parallel with respect to the substrate 40 to permit wire bonding to appropriate portions of the substrate. For example, the negative DC bus bar 34a may be wire bonded to the emitter plating 43a of the low side, while the positive DC bus bar 36a may be wire bonded to the collector plating 44b of the high side. The emitters of the IGBTs 48 and anodes of the diodes 50 may be wire bonded to the respective emitter plating 43a, 43b. Wire bonding in combination with the rigid structure of the DC bus 16 and housing 12 may also eliminate the need for a hard potting compound typically used to provide rigidity to protect solder interfaces. For low cost, the copper layers 40a and 40c may be nickel finished or aluminum clad, although gold or palladium may be employed at the risk of incurring higher manufacturing costs.

Figure 4:
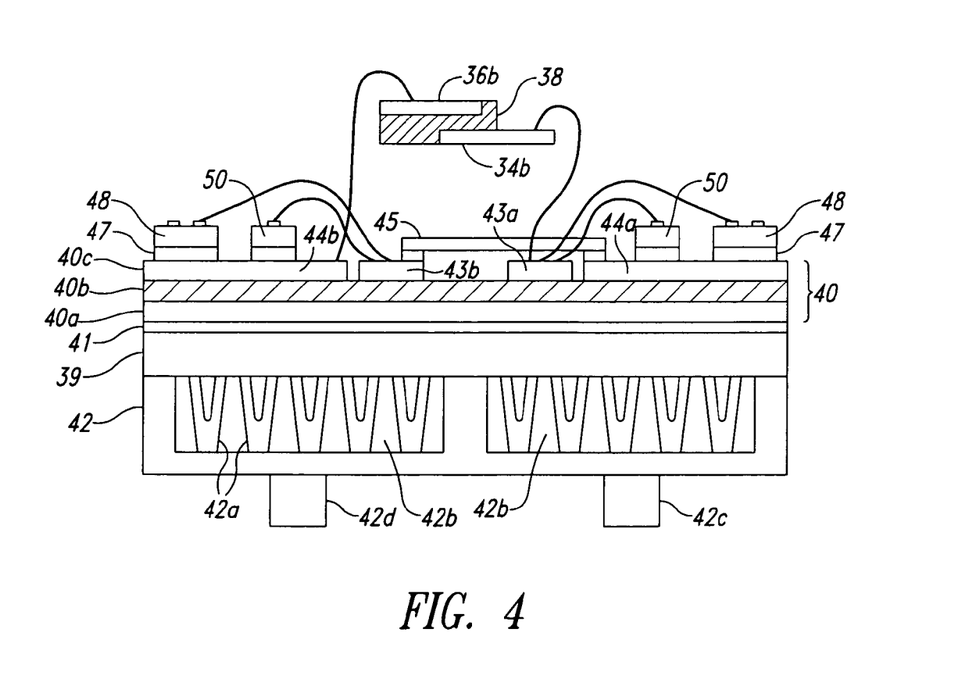
FIG. 4 is a schematic cross sectional view of one embodiment of the DC bus comprising a pair of generally planar DC bus bars spaced by an electrical insulation.

FIG. 4 shows another embodiment of the DC bus 16 for use in the power module 10, the DC bus 16 comprising a pair of generally planar DC bus bars 34b, 36b parallel and spaced from one another by a bus bar insulation 38. The DC bus bars 34b, 36b are horizontal with respect to a substrate 40 (FIGS. 1 and 2), with exposed portions to permit wire bonding to the various portions of the substrate 40.

Because the DC bus bars 34, 36 are parallel, counter flow of current is permitted, thereby canceling the magnetic fields and their associated inductances. In addition the parallel DC bus bars 34, 36 and bus bar insulation 38 construct a distributed capacitance. As will be understood by one of ordinary skill in the art, capacitance dampens voltage overshoots that are caused by the switching process. Thus, the DC bus bars 34, 36 of the embodiments of FIGS. 3 and 4 create a magnetic field cancellation as a result of the counter flow of current, and capacitance dampening as a result of also establishing a functional capacitance between them and the bus bar insulation 38.

As best illustrated in FIG. 2B, the power semiconductor devices 20 may include a number of decoupling, high frequency capacitors 55 which are electrically coupled between the DC bus bars 34, 36 and ground to reduce EMI. In contrast to prior designs, the capacitors 55 are located on the substrate 40 inside the housing 12. For example, some of the capacitors 55 are electrically coupled directly to the emitter plating 43a on the low side of the substrate 40 and some of the capacitors 55 are electrically coupled directly to the collector plating 44b on the high side of the substrate 40. The capacitors 55 can be soldered in the same operation as the soldering of the substrate 40 to the cold plate 14.

The power semiconductor devices 20 may also include a number of snubber capacitors (not shown) electrically coupled between the DC bus bars 34, 36 to clamp voltage overshoot. For example, some of the snubber capacitors are electrically coupled directly to the emitter plating 43a on the low side of the substrate 40 and the collector plating 44b on the high side of the substrate 40. Significant savings may be realized by effective clamping of voltage overshoot. For example, if switching transients are maintained below approximately 900V, a transformer may be eliminated. The snubber capacitors can be soldered in the same operation as the soldering of the substrate 40 to the cold plate 14.

As best illustrated in FIGS. 1 and 2A, the DC bus bars 34, 36 each include three terminals 24, 26, spaced along the longitudinal axis, to make electrical connections, for example, to a DC power source. Without being restricted to theory, Applicants believe that the spacing of the terminals 24, 26 along the DC bus bars 34, 36 provides lower inductance paths within the DC bus bars 34, 36 and to the external DC voltage storage bank.

In contrast to typical power modules, the DC bus bars 34, 36 are internal to the housing 12. This approach results in better utilization of the bus voltage, reducing inductance and consequently permitting higher bus voltages while maintaining the same margin between the bus voltage and the voltage rating of the various devices. The lower inductance reduces voltage overshoot, and problems associated with voltage overshoot such as device breakdown. The increase in bus voltage permits lower currents, hence the use of less costly devices. The bus bar insulation 38 between the DC bus bars 34, 36 may be integrally molded as part of the housing 12, to reduce cost and increase structural rigidity. The DC bus bars 34, 36 may be integrally molded in the housing 12, or alternatively, the DC bus bars 34, 36 and bus bar insulation 38 may be integrally formed as a single unit and attached to the housing 12 after molding, for example, via post assembly.

The power semiconductor devices 20 are directly mounted on the substrate 40 which is directly attached to the cold plate 14 via solder layer 41, the resulting structure serving as a base plate. The use of a cold plate 14 as the base plate, and the direct mounting of the power semiconductor devices 20 thereto, enhances the cooling for the power semiconductor devices 20 over other designs, producing a number of benefits such as prolonging the life of capacitors 55.

The power semiconductor devices 20 are operable to transform and/or condition electrical power. As discussed above, the power semiconductor devices 20 may include switches 48 and/or diodes 50. The power semiconductor devices 20 may also include other electrical and electronic components, for example, capacitors 55 and inductors, either discrete or formed by the physical layout. The power module 10 and power semiconductor devices 20 may be configured and operated as an inverter (DC→AC), rectifier (AC→DC), and/or converter (DC→DC; AC→AC). For example, the power module 10 and/or power semiconductor devices 20 may be configured as full three phase bridges, half bridges, and/or H-bridges, as suits the particular application.

Figure 5:
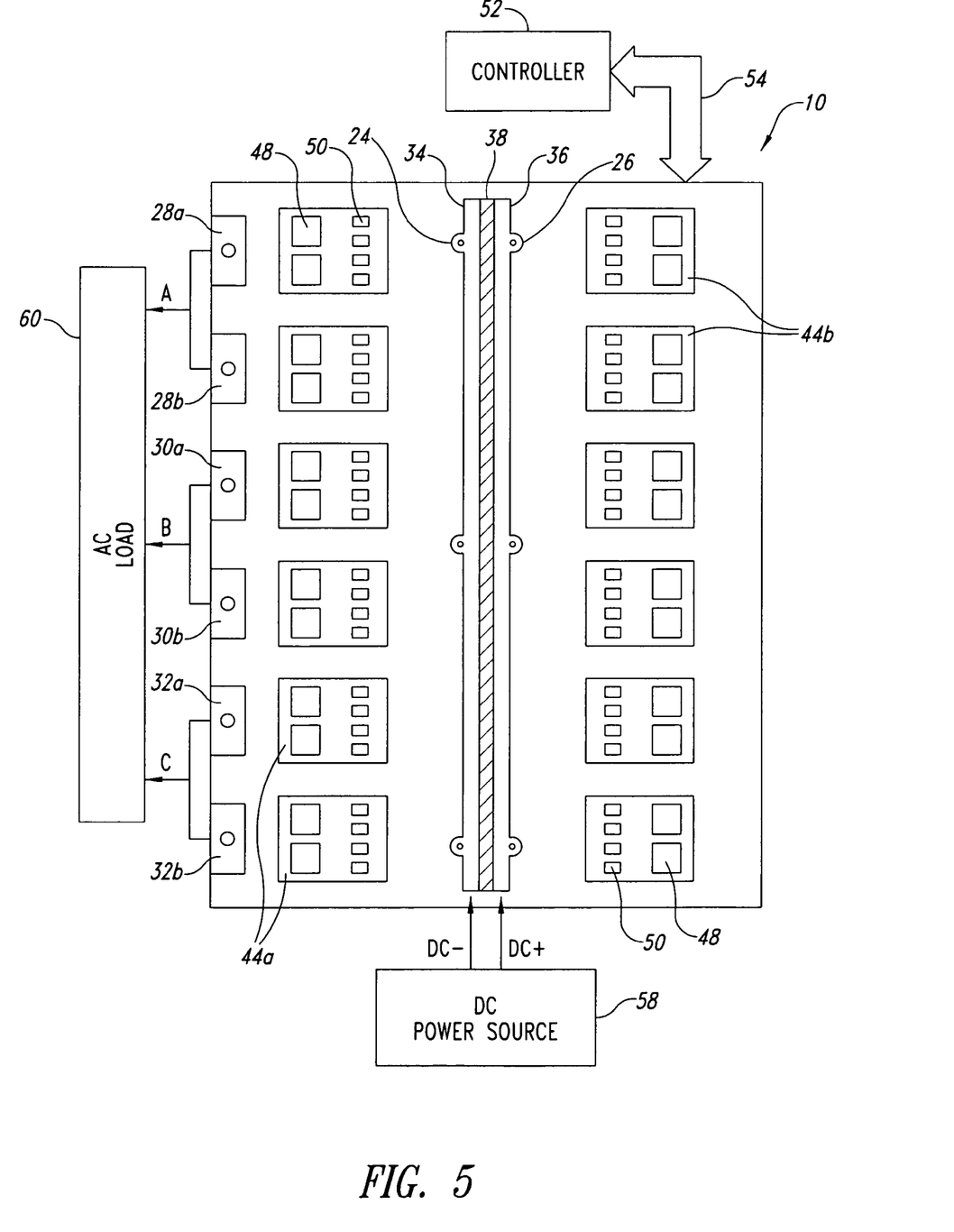
FIG. 5 is a topological view a single power module configured as a power inverter between a power source and a load, illustrating some aspects of the architecture of the power module and the topology of the substrate.

FIG. 5 topographically illustrates the layout of the substrate 40, employing twelve distinct regions of collector plating 44a, 44b, denominated collectively below as regions 44. The regions 44 are generally arranged in a low side row of six areas of collector plating 44a and a high side row of six areas of collector plating 44b. Each region 44 can carry a variety of switches such as IGBTs 48 and/or a variety of diodes 50. The gate drivers 22 are coupled to control the power semiconductor devices 20, particularly the switches 48, based on signals received from a controller 52 via a signal bus 54, which may also be integrated into the power module 10 or which may be provided separately therefrom.

A base or standard region 44 typically carries two IGBTs 48 and four diodes 50. However, the inclusion of specific component types (switches such as IGBTs 48 and/or diodes 50) and the number of each component on a region 44 may depend on the specific application. For example, a region 44 may carry up to four IGBTs 48, or alternatively, up to eight diodes 50. Alternatively, a region 44 may carry four diodes 50 and omit IGBTs 48, for example, where the power semiconductor devices 20 on the region 44 will act as a rectifier. The ability to eliminate components where the specific application does not require these components provides significant cost savings. For example, eliminating IGBTs 48 can save many dollars per region 44. The ability to add additional components of one type in the place of components of another type on a region 44 provides some flexibility in adjusting the current and/or voltage rating of the power module 10. Thus, this modular approach reduces costs, and provides flexibility in customizing to meet demands of a large variety of customers. Of course other sizes of regions 44, which may carry more or fewer components, are possible.

The overall design of the standard power module 10, including the position and structure of the DC and AC buses 16, 18, topology and modularity of substrates 40 and the inclusion of six phase terminals 28a, 28b, 30a, 30b, 32a, 32b in the AC bus 18 provides great flexibility, allowing the standard power module 10 to be customized to a variety of applications with only minor changes and thus relatively small associated costs. A number of these applications are discussed below.

Tri-Level Inverter

FIGS. 6-10 illustrate fri-level inverters that take advantage inter alia, of the inclusion of two terminals per phase in the design of the base power module 10. This approach reduces the size and cost over prior fri-level inverters which employ two separate bi-level modules for each phase, requiring fairly complex external coupling schemes.

Figure 6:
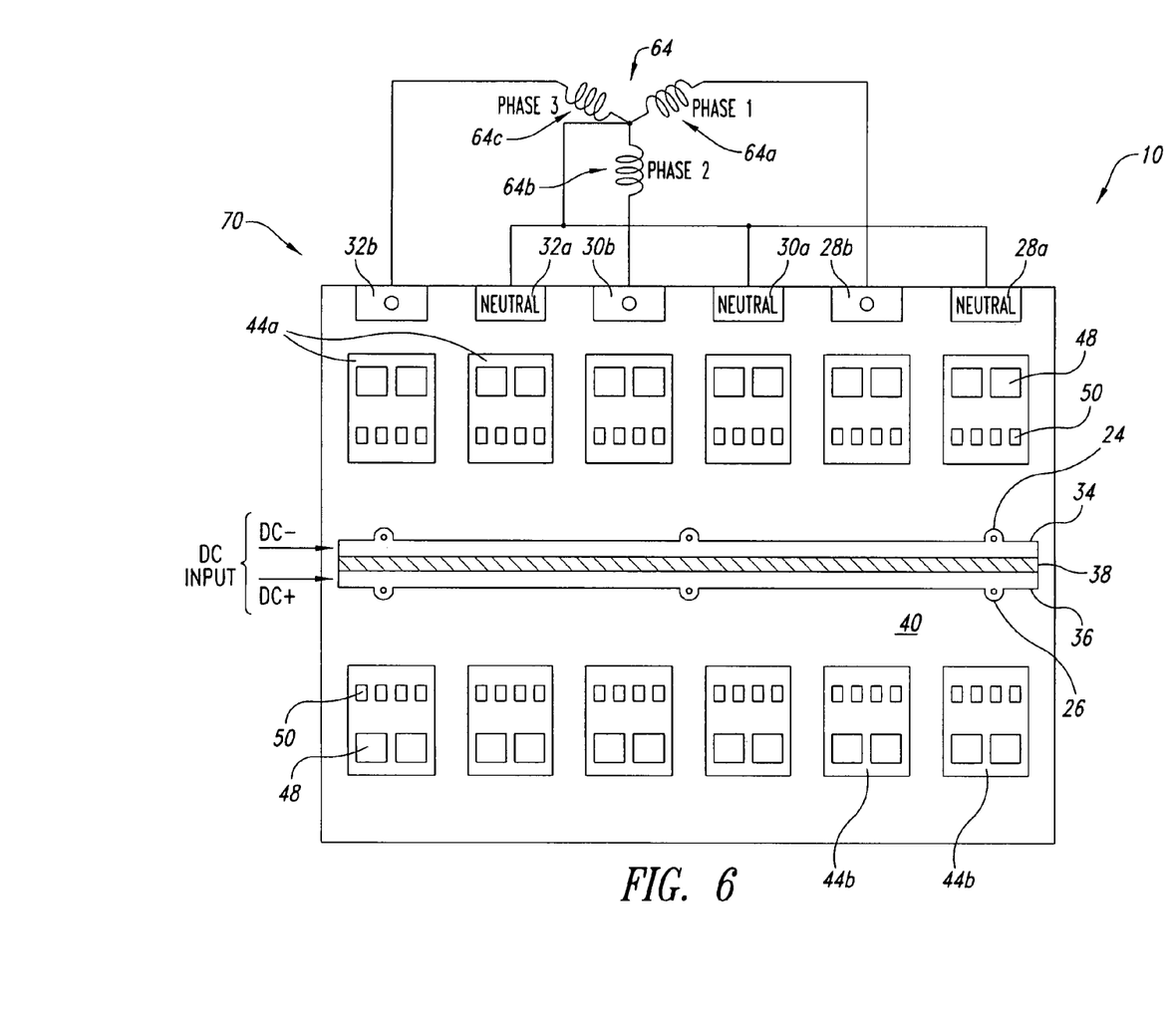
FIG. 6 is a topological view of a single power module configured as a tri-level inverter between a power source and a three-phase load, illustrating some aspects of the architecture of the power module and the topology of the substrate.

FIG. 6 shows an embodiment of a tri-level inverter 70 implemented with the base power module 10. One phase terminal 28a, 30a, 32a in each pair of phase terminals is coupled to a neutral line in the housing 12 of the power module 10, to provide a reference to a respective phase 64a, 64b, 64c of a three-phase load 64, such as a motor. The other terminal 28b, 30b, 32b of each pair of phase terminals is electrically coupled to provide the first, second, and third voltages $V_1, V_2, V_3$ across the respective phase 64a, 64b, 64c of the three-phase load 64.

Figure 7:
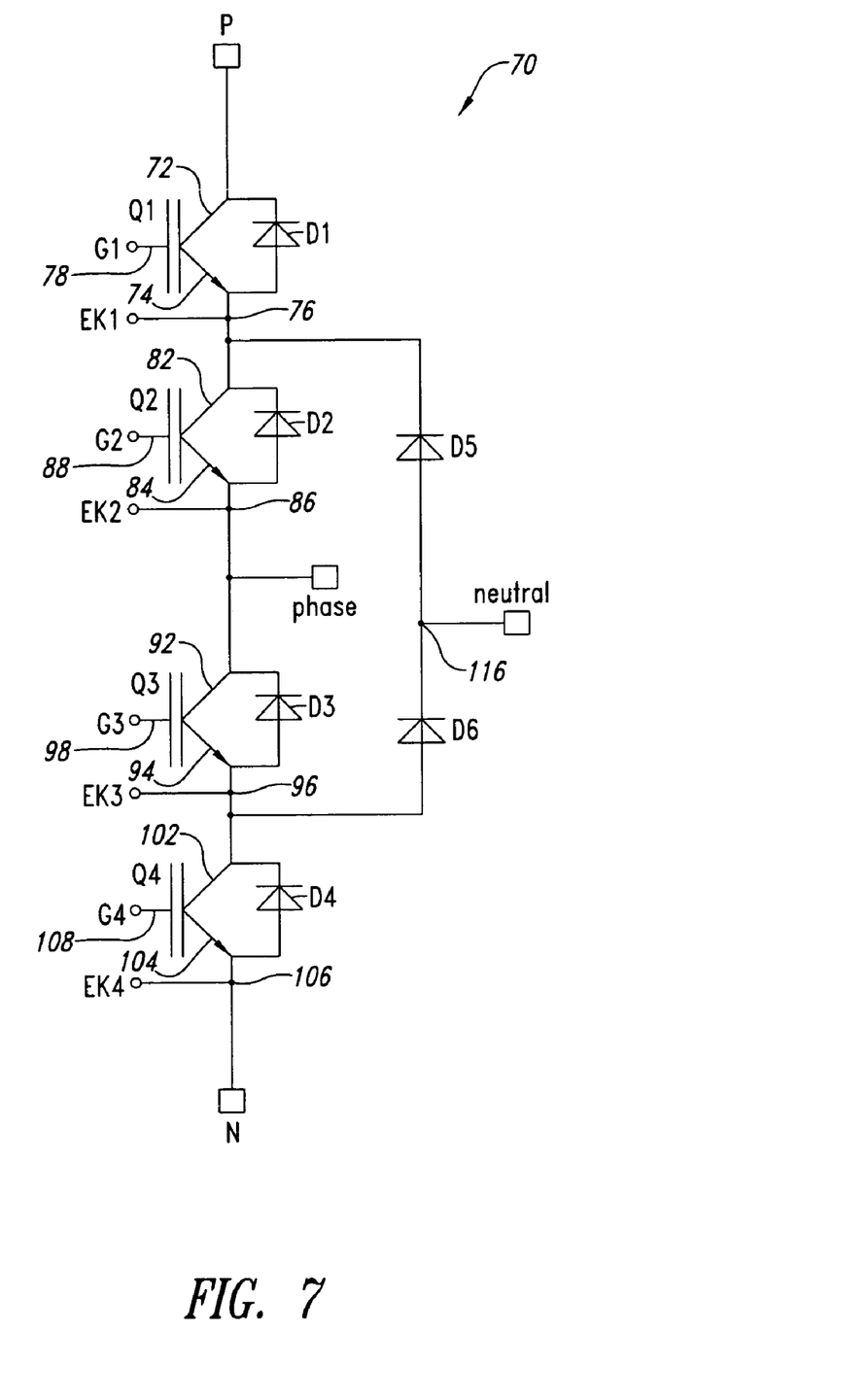
FIG. 7 is an electrical schematic view of a single-phase tri-level inverter (or one phase of a three-phase tri-level inverter).

FIG. 7 is an electrical schematic of a single-phase tri-level inverter 70, or one phase of a three-phase tri-level inverter. The collector 72 of a first transistor Q1 is coupled to a positive DC supply line P. The emitter 74 of the first transistor Q1 is connected to a first node 76. A first anti-parallel diode D1 is connected between the collector 72 and the emitter 74 of the first transistor Q1. The base 78 of the first transistor Q1 is coupled to a first control line G1. The first node 76 is coupled to a first control reference line EK1.

The collector 82 of a second transistor Q2 is coupled to the first node 76. The emitter 84 of the second transistor Q2 is connected to a second node 86. A second anti-parallel diode D2 is connected between the collector 82 and the emitter 84 of the second transistor Q2. The base 88 of the second transistor Q2 is coupled to a second control line G2. The second node 86 is coupled to a second control reference line EK2.

The collector 92 of a third transistor Q3 is coupled to the second node 86. The emitter 94 of the third transistor Q3 is connected to a third node 96. A third anti-parallel diode D3 is connected between the collector 92 and the emitter 94 of the third transistor Q3. The base 98 of the third transistor Q3 is coupled to a third control line G3. The third node 96 is coupled to a third control reference line EK3.

The collector 102 of a fourth transistor Q4 is coupled to the third node 96. The emitter 104 of the fourth transistor Q4 is connected to a fourth node 106. A fourth anti-parallel diode D4 is connected between the collector 102 and the emitter 104 of the fourth transistor Q4. The base 108 of the fourth transistor Q4 is coupled to a fourth control line G4. The fourth node 106 is coupled to a fourth control reference line EK4 and to a negative DC supply line N.

A fifth diode D5 is coupled between the first node 76 and a fifth node 116. A sixth diode D6 is coupled between the fifth node 116 and the third node 96. The second node 86 provides a phase-output of the tri-level inverter 70 and the fifth node 116 provides a neutral line for the phase output. For improved performance characteristics, parallel components may be used. For example, each transistor illustrated in FIG. 7 may actually represent two or more parallel transistors.

Switched voltage states for the tri-level inverter 70 of FIG. 7 can be realized as follows. A first voltage state of zero volts across the second node 86 and the fifth node 116 can be achieved by (a) applying a low signal (for example, zero volts) to the first control line G1 with respect to the first control reference line EK1; (b) applying a high signal (for example, 15 volts DC) to the second control line G2 with respect to the second control reference line EK2; (c) applying a high signal (for example, 15 volts DC) to the third control line G3 with respect to the third control reference line EK3; and (d) applying a low signal (for example, zero volts) to the fourth control line G4 with respect to the fourth control reference line EK4.

A second output state of P volts (a positive voltage) across the second node 86 and the fifth node 116 can be achieved by (a) applying a high signal (for example, 15 volts DC) to the first control line G1 with respect to the first control reference line EK1; (b) applying a high signal (for example, 15 volts DC) to the second control line G2 with respect to the second control reference line EK2; (c) applying a low signal (for example, zero volts) to the third control line G3 with respect to the third control reference line EK3; and (d) applying a low signal (for example, zero volts) to the fourth control line G4 with respect to the fourth control reference line EK4.

A third output voltage state of N volts (a negative output voltage) across the second node 86 and the fifth node 116 can be achieved by (a) applying a low signal (for example, zero volts) to the first control line G1 with respect to the first control reference line EK1; (b) applying a low signal (for example, zero volts) to the second control line G2 with respect to the second control reference line EK2; (c) applying a high signal (for example, 15 volts DC) to the third control line G3 with respect to the third control reference line EK3; and (d) applying a high signal (for example, 15 volts DC) to the fourth control line G4 with respect to the fourth control reference line EK4.

By controlling the first through fourth transistors Q1-Q4 using the first through fourth control lines G1-G4 and the first through fourth control reference lines EK1-EK4, an output can deliver an alternating voltage with three values: P, zero and N. After reviewing the specification, one of skill in the art will recognize that it is the difference in potential between respective control lines and control reference lines that controls the operation of the transistors Q1-Q4. Appropriate control signals may be generated by the controller 52 (see FIG. 5).

Figure 8:
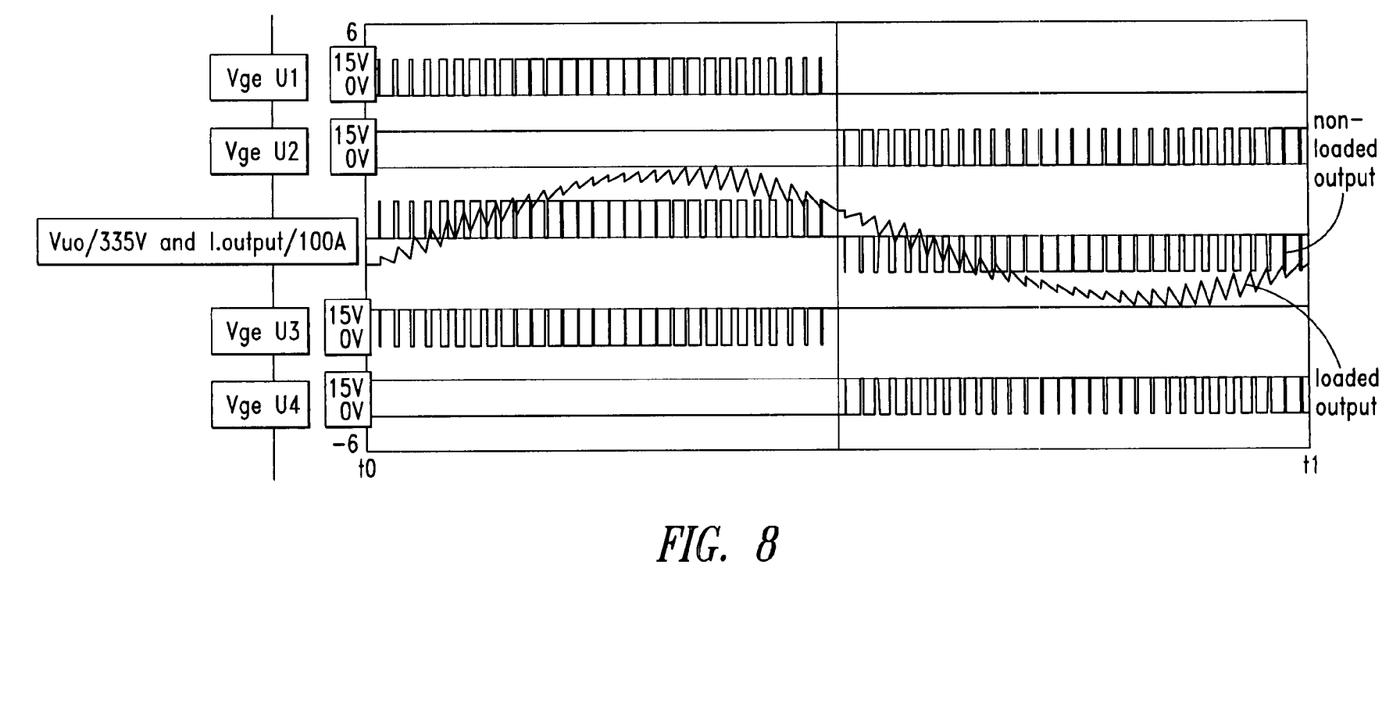
FIG. 8 is a timing diagram illustrating example outputs produced by the tri-level inverter of FIG. 7 in response to a particular series of control signals.

The tri-level inverter 70 when connected to a typical load (see FIG. 6), such as a motor (not shown), can be controlled so as to supply an approximately sinusoidal alternating current output for particular load conditions. This principle is illustrated in FIG. 8, which is a timing diagram for the tri-level inverter 70 of FIG. 7 illustrating an example output voltage between a time period $t_0$ and a time period $t_1$. Voltage level U1 shows the voltage applied to the first control line G1 with respect to the first control reference line EK1. Voltage level U2 shows the voltage applied to the second control line G2 with respect to the second control reference line EK2. Voltage level U3 shows the voltage applied to the third control line G3 with respect to the third control reference line EK3. Voltage level U4 shows the voltage applied to the fourth control line G4 with respect to the fourth control reference line EK4.

Figure 9:
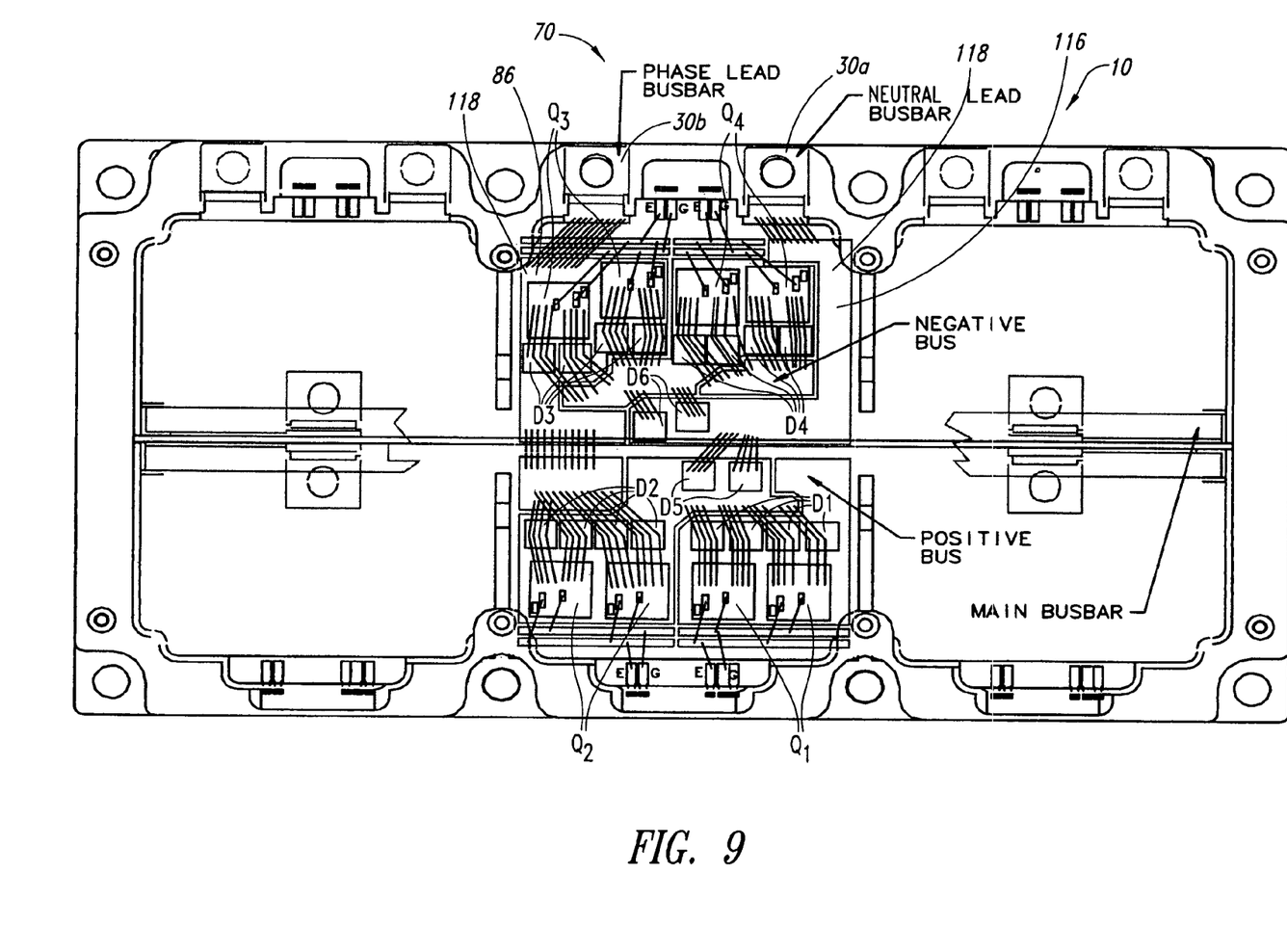
FIG. 9 is a top view of a tri-level inverter implemented in the power module of FIG. 1.

FIG. 9 illustrates a top view of an embodiment of the single-phase tri-level inverter 70 of FIG. 7 implemented in the base power module 10 of FIG. 1. The lead 30a of the base power module 10 is coupled to the fifth node 116 of the tri-level inverter 70 and the phase lead 30b of the base power module 10 is coupled to the second node 86 of the tri-level inverter 70.

Figure 10:
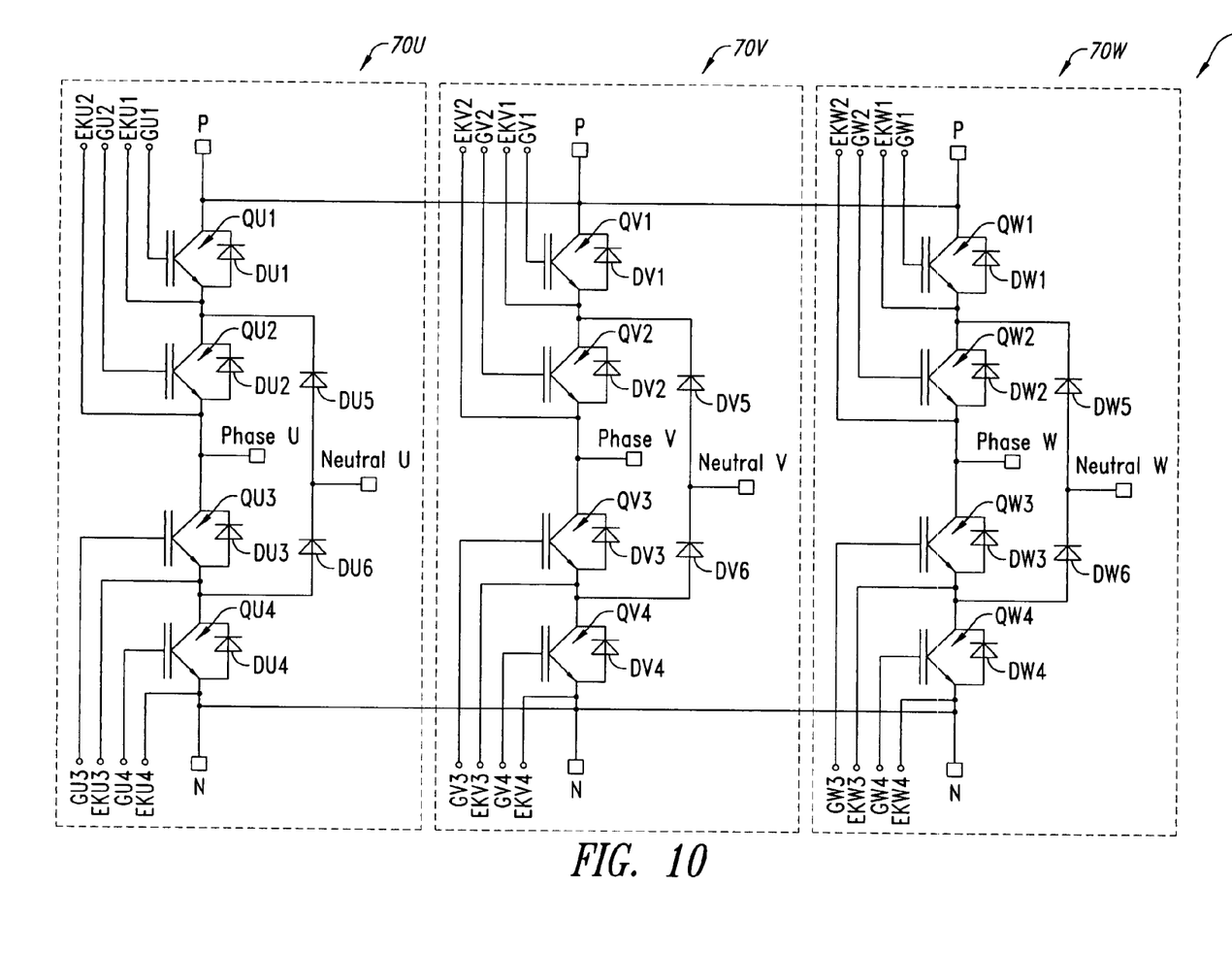
FIG. 10 is an electrical schematic view of a three-phase tri-level inverter.

FIG. 10 is an electrical schematic of a three-phase, tri-level inverter 70. It comprises three phase circuits 70U, 70V, 70W, each of which is a single-phase tri-level inverter circuit as described in FIG. 7. The three neutral lines neutral U, neutral V, neutral W may be coupled together to a single neutral bus (not shown). After reviewing the specification, one of skill in the art will recognize that other multi-level inverters, such as an inverter configured to operate in four, non-loaded voltage states, may be employed.

Although specific embodiments of and examples for the power module and method of the invention are described herein for illustrative purposes, various equivalent modifications can be made without departing from the spirit and scope of the invention, as will be recognized by those skilled in the relevant art. The teachings provided herein of the invention can be applied to power module and power converters, rectifiers and/or inverters not necessarily the exemplary power module and systems generally described above.

While elements may be describe herein and in the claims as "positive" or "negative" such denomination is relative and not absolute. Thus, an element described as "positive" is shaped, positioned and/or electrically coupled to be at a higher relative potential than elements described as "negative" when the power module 10 is coupled to a power source. "Positive" elements are typically intended to be coupled to a positive terminal of a power source, while "negative" elements are intended to be coupled to a negative terminal or ground of the power source. Generally, "positive" elements are located or coupled to the high side of the power module 10 and "negative" elements are located or coupled to the low side of the power module 10.

The power modules described above may employ various methods and regimes for operating the power modules 10 and for operating the switches (e.g., IGBTs 48). The particular method or regime may be based on the particular application and/or configuration. Basic methods and regimes will be apparent to one skilled in the art, and do not form the basis of the inventions described herein so will not be discussed in detail for the sake of brevity and clarity.

The various embodiments described above can be combined to provide further embodiments. All of the above U.S. patents, patent applications and publications referred to in this specification, including but not limited to: Ser. Nos. 60/233,992; 60/233,993; 60/233,994; 60/233,995 and 60/233,996 each filed Sep. 20, 2000; U.S. Ser. No. 09/710, 145 filed Nov. 10, 2000; U.S. Ser. Nos. 09/882,708 and 09/957,047 both filed Jun. 15, 2001; U.S. Ser. Nos. 09/957, 568 and 09/957,001 both filed Sep. 20, 2001; U.S. Ser. No. 10/109,555 filed Mar. 27, 2002, Ser. No. 60/471,387 filed May 16, 2003 entitled POWER MODULE ARCHITECTURE (Express Mail No. EV347013359US), and an application filed Aug. 14, 2003 entitled Dual Power Module Power System Architecture (Express Mail No. EV336598819US) are incorporated herein by reference, in their entirety, as are the sections which follow this description. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to comprise all power modules, rectifiers, inverters and/or converters that operate or embody the limitations of the claims. Accordingly, the invention is not limited by the disclosure, but instead its scope is to be determined entirely by the following claims.

The invention claimed is:

1. A power module, comprising:
   a module housing;
   a cold plate integrated into the module housing, said cold plate including a direct copper bonded substrate attached to a base plate by a solder layer;
   a DC bus bar including first and second bus bars separated by bus bar insulation that is integrally molded as part of the module housing;
   a set of DC terminals accessible from an exterior of the module housing;
   at least three pairs of AC terminals accessible from the exterior of the module housing; and
   an inverter circuit contained within the module housing, the inverter circuit configurable to selectively switch between at least three output states and electrically coupled between the set of DC terminals and at least one of the pairs of AC terminals.

2. The power module of claim 1, further comprising a set of control terminals accessible from the exterior of the module housing and electrically coupled to the inverter circuit.

3. The power module of claim 1, wherein the inverter circuit comprises at least three pairs of output nodes each electrically coupled to a respective one of the pairs of AC terminals.

4. The power module as recited in claim 1, wherein the direct copper bonded substrate includes a first copper layer, a ceramic layer and a second copper layer fused together.

5. The power module as recited in claim 4, wherein the second copper layer is etched to form electrically isolated structures for selectively mounting circuit components.

6. The power module as recited in claim 4 wherein the base plate includes a first side to which the solder layer is attached and a second side in thermal contact with a fluid channel for cooling circuit components mounted to the direct copper bonded substrate.

7. The power module as recited in claim 1, wherein the DC bus bar is integrally molded as part of the housing.

8. A power system, comprising:
   a DC power supply;
   a power module, comprising:
   a housing including an integrated cold plate, wherein the cold plate includes a direct copper bonded substrate attached to a base plate by a solder layer;
   a pair of input terminals accessible from an exterior of the housing, the input terminals electrically coupled to the DC power supply;
   a DC bus electrically coupled to the pair of input terminals, wherein the DC bus includes first and second bus bars separated by insulation that is integrally molded as part of the housing;
   three pairs of output terminals accessible from the exterior of the housing;
   an AC bus electrically coupled to at least one of the three pairs of output terminals; and
   an inverter circuit configurable to selectively operate in one of at least three output states and electrically coupled between the DC bus and the AC bus; and
   a controller to generate control signals to control the inverter circuit.

9. The power system of claim 8 wherein the controller is contained within the housing of the power module.

10. The power system of claim 8, further comprising:
    a load, wherein each pair of output terminals is electrically coupled to the AC bus to supply a respective phase of three-phase AC power to the load.

11. The power system of claim 8, further comprising:
    a number of loads, wherein each pair of output terminals is electrically coupled to the AC bus to supply AC power to a respective one of the loads.

12. The power module as recited in claim 8, wherein the direct copper bonded substrate includes a first copper layer, a ceramic layer and a second copper layer fused together.

13. The power module as recited in claim 12, wherein the second copper layer is selectively segmented to define a plurality of electrically isolated structures for selectively mounting inverter circuit components.

14. The power module as recited in claim 12, wherein the base plate includes a first side to which the solder layer is attached and a second side in thermal contact with a fluid channel for cooling circuit components mounted to the direct copper bonded substrate.

15. The power module as recited in claim 8, wherein the DC bus bar is integrally molded as part of the housing.

* * * * *